United States Patent [19]

Hatanaka et al.

[11] Patent Number: 4,912,714
[45] Date of Patent: Mar. 27, 1990

[54] APPARATUS FOR DRIVING A SEMICONDUCTOR LASER DEVICE

[75] Inventors: Kazuomi Hatanaka, Ikoma; Takashi Ohno, Tammadainishi; Kenji Ogou, Nara, all of Japan

[73] Assignee: Sharp Kabushiki Kaisha, Osaka, Japan

[21] Appl. No.: 368,106

[22] Filed: Jun. 19, 1989

Related U.S. Application Data

[63] Continuation of Ser. No. 181,092, Apr. 13, 1988, abandoned.

[30] Foreign Application Priority Data

| Apr. 13, 1987 | [JP] | Japan | 62-90168 |
| Apr. 13, 1987 | [JP] | Japan | 62-90169 |
| Apr. 13, 1987 | [JP] | Japan | 62-90170 |
| Apr. 13, 1987 | [JP] | Japan | 62-90171 |
| Apr. 13, 1987 | [JP] | Japan | 62-90172 |
| Feb. 5, 1988 | [JP] | Japan | 63-25886 |
| Mar. 9, 1988 | [JP] | Japan | 63-55747 |

[51] Int. Cl.⁴ .............................................. H01S 3/13
[52] U.S. Cl. .......................................... 372/31; 372/38
[58] Field of Search ............................. 372/29, 31, 38

[56] References Cited

U.S. PATENT DOCUMENTS

| 4,319,203 | 3/1982 | Brosio et al. | 372/30 |
| 4,516,242 | 5/1985 | Yokota | 372/29 |
| 4,592,057 | 5/1986 | Comerford | 372/31 |
| 4,612,671 | 9/1986 | Giles | 372/31 |
| 4,618,958 | 10/1986 | Shibata et al. | 372/29 |
| 4,621,376 | 11/1986 | Nakamura et al. | 455/613 |
| 4,685,097 | 8/1987 | van der Put | 369/54 |
| 4,692,606 | 9/1987 | Sakai et al. | 250/205 |

FOREIGN PATENT DOCUMENTS 1210070 8/1986 Canada .
0061034 3/1982 European Pat. Off. .

Primary Examiner—James W. Davie
Attorney, Agent, or Firm—Birch, Stewart, Kolasch & Birch

[57] ABSTRACT

An apparatus for driving a semiconductor laser device wherein the optical output of the laser device is maintained at a predetermined level by a feedback control. The apparatus includes at least two D/A converters. One of the D/A converters is used for conducting a coarse adjustment of the optical output level, and another of the D/A converters is used for conducting a fine adjustment of the optical output level.

24 Claims, 13 Drawing Sheets

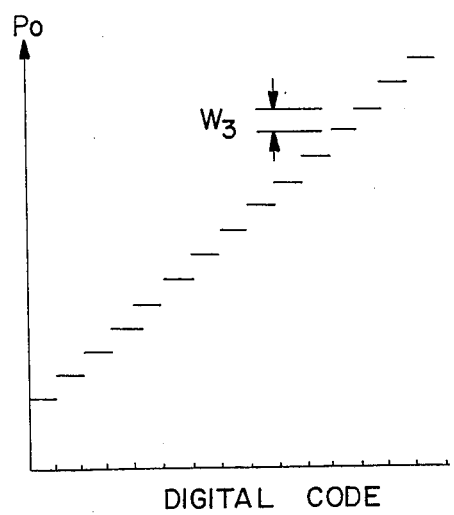
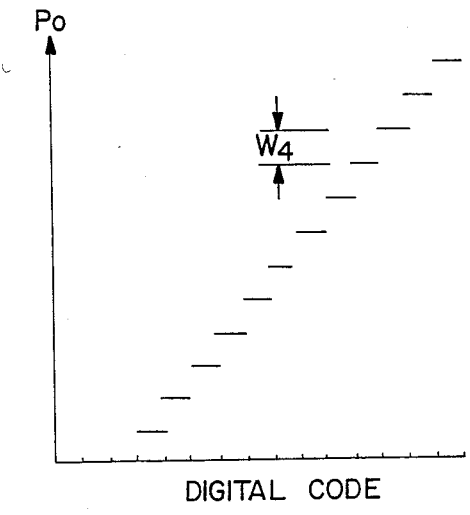
FIG. 18(a)                FIG. 18(b)
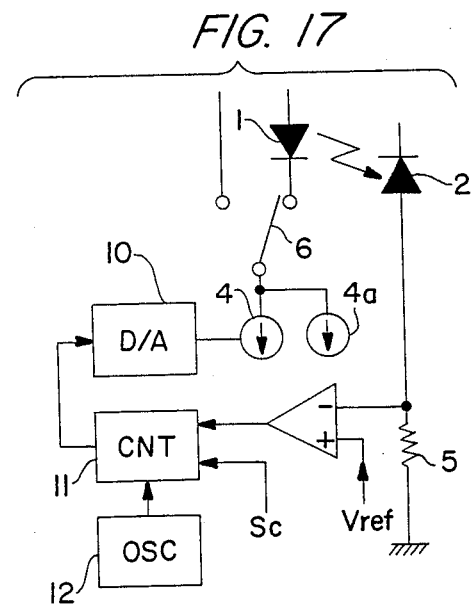
FIG. 17

APPARATUS FOR DRIVING A SEMICONDUCTOR LASER DEVICE

This application is a continuation of application Ser. No. 07/181,092 filed on Apr. 13, 1988, now abandoned.

BACKGROUND OF THE INVENTION

1. Field of the Invention:

The embodiments of this invention relate to a method of driving a semiconductor laser device and an apparatus for driving a semiconductor laser device.

2. Description of the Prior Art:

When driving a semiconductor laser device to obtain a laser beam, a forward current $I_F$ is supplied to a pn junction in the laser device. The relationship between the forward current $I_F$ and the optical output $P_O$ of a semiconductor laser device is not linear. As the forward current $I_F$ supplied to a semiconductor laser device increases, the laser device begins to oscillate a laser beam at a certain level of the current (a threshold current $I_{th}$). As the forward current $I_F$ increases further, the laser output $P_O$ also increases. FIG. 2 shows an example of the relationship between the forward current $I_F$ and the optical output $P_O$ of a semiconductor laser device.

The level of a threshold current $I_{th}$ and the rate of change in an optical output $P_O$ with respect to the changes in a forward current $I_F$ are not constant. The level varies according to an ambient temperature or to the individual semiconductor laser device. Such a rate of change in an optical output $P_O$ is called a differential efficiency $\eta$.

When a semiconductor laser diode is driven at an optical output of a constant level, the system shown in FIG. 3 is generally used. In this system, a semiconductor laser diode 1 is driven by a current source 4 which is controlled by the output of an amplifier 3. The optical output of the laser diode 1 is monitored by a photodiode 2, and the optical output is converted into a voltage by a resistor 5. The voltage is applied to an input terminal of the amplifier 3. The system shown in FIG. 3 constitutes a negative feedback loop. A reference voltage $V_{ref}$ is applied to the other input terminal of the amplifier 3 so that the optical output of the laser diode 1 is controlled to have a predetermined level corresponding to the reference voltage $V_{ref}$.

The system shown in FIG. 3 is used for obtaining a constant optical output of a predetermined level. In certain applications of a semiconductor laser diode, such as laser printing or optical communication, a semiconductor laser diode produces a constant optical output of a predetermined level and is turned on and off at a high speed. FIG. 4 shows an example of a system used for such an application.

The system of FIG. 4 comprises, in addition to the components in the system of FIG. 3, an analog switch 7 and a capacitor 8 which constitute a sample-hold circuit. The system of FIG. 4 further comprises a high-speed switch 6 and a buffer amplifier 9. The operation of the system of FIG. 4 will be described as follows. First, the switch 6 is set to the right position, and the switch 7 is turned on to obtain an optical output of a predetermined level corresponding to the reference voltage $V_{ref}$. Thereafter, the switch 7 is turned off. At this stage, the voltage applied to the amplifier 9 is held at the voltage level of the capacitor 8 so that the driving current supplied to the laser diode 1 is constantly maintained. Then, the switch 6 is turned off and on at a high speed and a high-speed switching of the optical output at a constant level results.

With the system shown in FIG. 4, it is difficult to maintain the optical output at a constant level for a long period of time since the voltage of the capacitor 8 is an analog value. The system illustrated in FIG. 5 has been proposed to solve this problem, i.e., the system can maintain the optical output at a constant level for a long period of time.

The system of FIG. 5 is not provided with the sample-hold circuit (the analog switch 7 and capacitor 8) and the buffer amplifier 9 which are used in the system of FIG. 4. The system of FIG. 5 comprises an up/down counter 11, a D/A converter 10, and an oscillator 12. In the system of FIG. 5, the amplifier 3 functions as a comparator. When the output of the comparator 3 is "HIGH", the up/down counter 11 counts up the output pulses of the oscillator 12. In contrast, the output of the comparator 3 is "LOW", in contrast, the counter 11 counts down the output pulses of the oscillator 12. The output of the counter 11 is converted into an analog value corresponding to the forward current $I_F$ by the D/A converter 10. When the switch 6 is set to the right position, the forward current $I_F$ from the current source 4 is supplied to the semiconductor laser diode 1 to drive the laser diode 1. The system of FIG. 5 constitutes a negative feedback loop so that the optical output of the laser diode 1 is regulated at a constant value corresponding to the reference voltage $V_{ref}$. An error which corresponds to one pulse of the output of the oscillator 12 may occur in the level of the optical output.

Since digital codes are used in the feedback loop, the system of FIG. 5 can maintain the light output at a constant level for a long period of time. In the system of FIG. 5, however, the D/A converter 10 should have high resolution in order to maintain an optical output which is regulated to a constant level with high accuracy because the $I_F-P_O$ characteristics of a semiconductor laser diode are not linear.

The $I_F-P_O$ characteristics of a semiconductor laser diode are such that, if a forward current $I_F$ is less than the threshold current $I_{th}$, laser oscillation does not occur. Accordingly, if the forward current $I_F$ is less than the threshold current $I_{th}$, the system cannot be used for control in driving the laser diode. For this reason, the quantization error of the optical output $P_O$ is greater than the quantization error of the forward current $I_F$, and a smaller accuracy for controlling the optical output $P_O$ result.

The above-mentioned problem will be discussed in more detail. FIG. 12(a) shows a relation between an input (digital codes) and an output (forward current $I_F$) of a D/A converter which are usually used in a conventional system such as shown in FIG. 5. FIG. 12(b) shows a relation between optical outputs $P_O$ of a laser diode and digital codes in the conventional system of FIG. 5 which employs a D/A converter having the linear characteristics as shown in FIG. 12(a). The digital codes corresponding to values lower than the threshold current $I_{th}$ of a laser diode do not contribute to the optical output of the laser diode. Therefore, shown in FIG. 12(b), the range of the codes which are effective in practical use is restricted, and a reduced effective resolution of the D/A converter 10 results. In FIG. 12(b), "$W_q$" indicates a quantization width of the optical output $P_O$.

In the system of FIG. 5, an optical output of a desired level can be obtained by applying a reference voltage $V_{ref}$ which corresponds to the desired optical output level and closes the negative feedback loop (hereinafter, this process is referred as "calibration"). As the calibration is not directly related to the driving operation of the laser diode 1, it is difficult to employ the system of FIG. 5 in an apparatus in which the optical output level should be changed very frequently. For example, in an optical magnetic disk recording apparatus, the optical output is changed into three levels (reading, erasing, and recording levels).

SUMMARY OF THE INVENTION

The apparatus for driving a semiconductor laser device in the embodiments of this invention, which overcomes the above-discussed and numerous other disadvantages and deficiencies of the prior art, the optical output of the laser device is maintained at a predetermined level by a feedback control. The apparatus comprises at least two D/A converters one of the D/A converters is used for conducting a coarse adjustment of the optical output level, and another D/A converter is used for conducting a fine adjustment of the optical output level.

In a preferred embodiment, at least two feedback loops are formed for conducting the feedback control, and the D/A converters are disposed in the respective feedback loops.

In another preferred embodiment, a D/A converter is disposed in a feedback loop for controlling the optical output of the laser device, and the D/A converter has non-linear characteristics.

In a further preferred embodiment, a D/A converter is disposed in a feedback loop for controlling the optical output of the laser device, and the D/A converter provides an offset output.

In an additional preferred embodiment, a D/A converter is disposed in a feedback loop for controlling the optical output of the laser device. A current supplier is separately provided from the feedback loop, and the current supplier supplies a current of a predetermined level to the laser device.

In a another preferred embodiment, a D/A converter is provided. The input of the D/A converter is connected to a controller for controlling the optical output of the laser device. The controller comprises a memory in which one or more relations between the optical output levels of the laser device the output levels of the controller are previously stored. The controller calculates a level of an output from the stored relations which corresponds to a predetermined optical output level and supplies an output of the calculated level to the D/A converter.

Thus, the embodiments of this invention described herein makes possible the objectives of (1) providing an apparatus for driving a semiconductor laser device which can control an optical output level with high accuracy; and (2) providing an apparatus for driving a semiconductor laser diode which can change the optical output to desired levels at a very high frequency.

BRIEF DESCRIPTION OF THE DRAWINGS

The embodiments of invention may be better understood and its numerous objects and advantages will become apparent to those skilled in the art by reference to the accompanying drawings as follows:

FIG. 17 is a diagram showing a seventh embodiment of the invention;

FIGS. 18(a) and 18(b) are graphs showing relations between digital codes and the optical output of the laser diode, according to the seventh embodiment as shown in FIG. 17.

DESCRIPTION OF THE PREFERRED EMBODIMENTS

Figure 1:
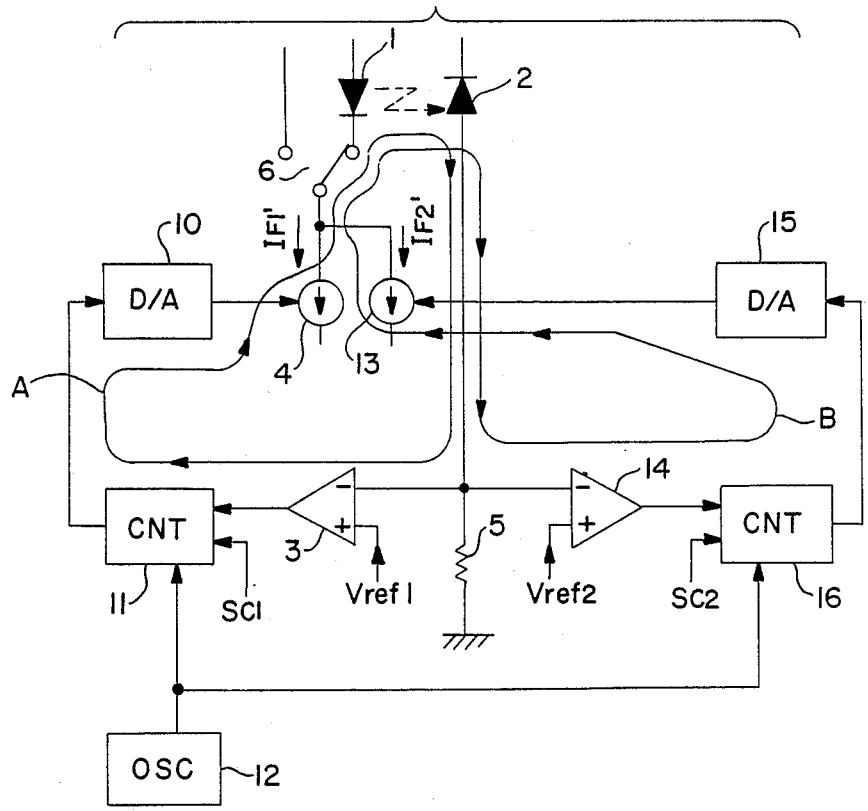
FIG. 1 is diagram showing a first embodiment of the invention in which two negative feedback loops are formed.
Figure 2:
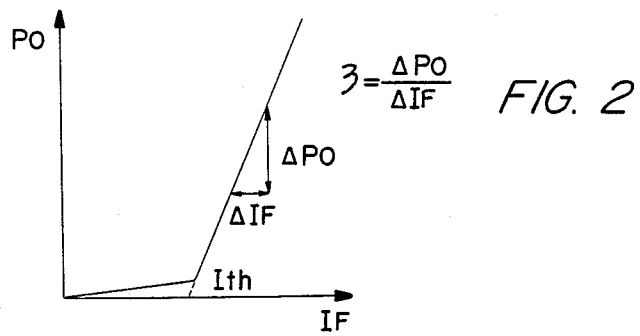
FIG. 2 is a graph showing a relation between a forward current $I_F$ and an optical output level of a laser diode.
Figure 3:
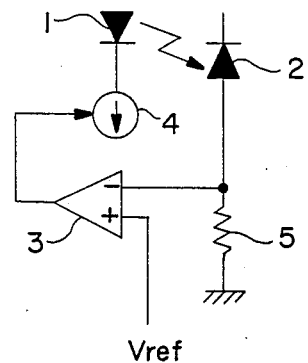
FIG. 3 is a diagram showing an example of a conventional apparatus.
Figure 4:
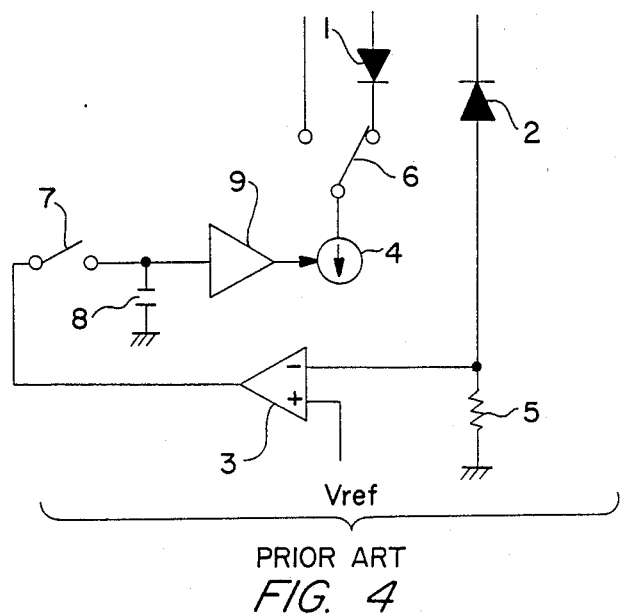
FIG. 4 is a diagram showing a second example of a conventional apparatus in which a sample-hold circuit is used and the optical output of a laser diode is switched at a high frequency.

FIG. 1 shows a block diagram of a first embodiment of the invention. The system of FIG. 1 drives a semiconductor laser diode 1 and comprises a photodiode 2 for monitoring the optical output of the laser diode 1, first and second comparators 3 and 14, first and second up/down counters 11 and 16, first and second D/A converters 10 and 15, first and second current sources 4 and 13 which are controlled respectively by the outputs of the D/A converters 10 and 15, a resistor 5, and a high-speed switch 6. A first reference voltage $V_{ref1}$ is applied to one input terminal of the first comparator 3, and a second reference voltage $V_{ref2}$ is applied to one input terminal of the second comparator 14. The first and second up/down counters 11 and 16 are controlled by the control signals $S_{C1}$ and $S_{C2}$, respectively. The system has two negative feedback loops A and B.

The first feedback loop A consists of the laser diode 1, the photodiode 2, the first comparator 3, the first counter 11, the first D/A converter 10, the first current source 4, and the switch 6. The first feedback loop A conducts a coarse adjustment of the optical output $P_O$.

The second feedback loop B consists of the laser diode 1, the photodiode 2, the second comparator 14, the second counter 16, the second D/A converter 15, the second current source 13, and the switch 6. The second feedback loop B conducts a fine adjustment of the optical output $P_O$.

Figure 5:
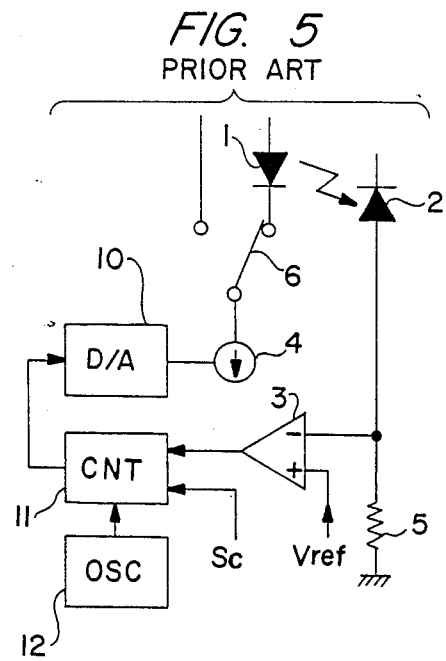
FIG. 5 is a diagram showing a third example of a conventional apparatus in which a D/A converter is disposed in a feedback loop.

In the system of FIG. 1, each of the two feedback loops A and B operate in approximately the same manner as the feedback loop that is used in the system of FIG. 5. However, the first reference voltage $V_{ref1}$ is set to a level corresponding to an optical output $P_{O1}$ which is slightly lower than a desired optical output $P_{O2}$, and the second reference voltage $V_{ref2}$ is set to a level corresponding to the desired optical output $P_{O2}$.

Figure 6:
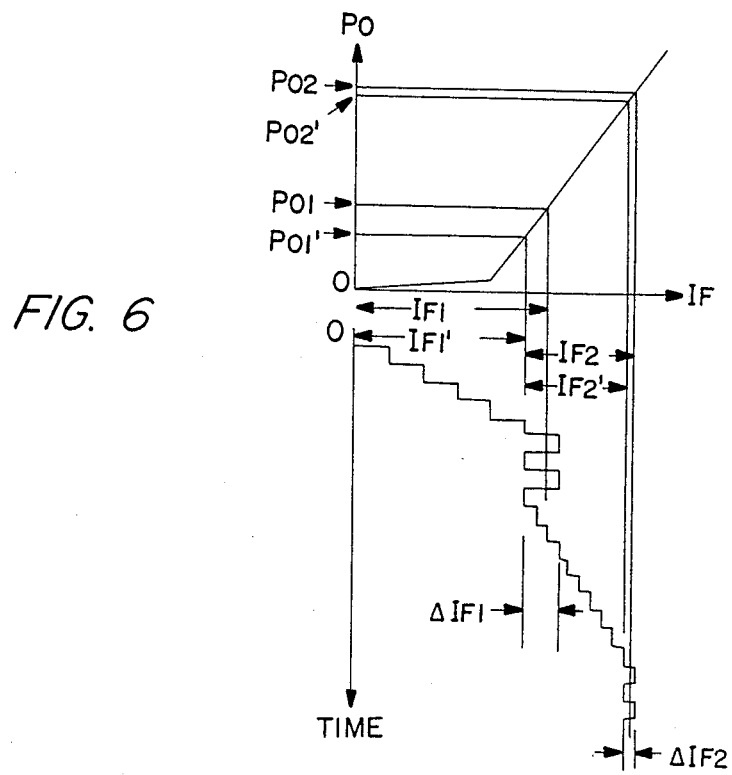
FIG. 6 is an graph showing a $I_F - P_O$ characteristic of a laser diode and also a manner of controlling the forward current according to the first embodiment as shown in FIG. 1.

The operation of the system of FIG. 1 will be described with reference to FIG. 6. The counters 11 and 16 are reset by the control signals $S_{C1}$ and $S_{C2}$ so that the current sources 4 and 13 do not supply a forward current to the laser diode 1. Then, the switch 6 is set to the right position. The first counter 11 is controlled to begin the count-up operation by the control signal $S_{C1}$ to actuate the first feedback loop A. The output current $I_{F1}'$ of the first current source 4 increases toward the level of the driving current $I_{F1}$ for producing the optical output $P_{O1}$. After reaching the current level $I_{F1}$, the forward current $I_{F1}'$ oscillates within the range of $\pm \Delta I_{F1}$ (i.e., $I_{F1}' = I_{F1} \pm \Delta I_{F1}$). The value $\Delta I_{F1}$ is obtained by multiplying the output current of the first current source 4 when the first D/A converter 10 is at full scale and the resolution of the first D/A converter 10. Namely, $\Delta I_{F1}$ is the current of the first current source 4 which corresponds to the LSB of the first D/A converter 10. Then, the first counter 11 halts the operation of counting the pulses of the oscillator 12, and maintains the output level of the value obtained at that time. The output current $I_{F1}'$ of the first current source 4 is kept at a constant value within the range of $I_{F1} \pm \Delta I_{F1}$.

Thereafter, the second counter 16 operates to count up the pulses of the oscillator 12 for actuating the second feedback loop B. The driving current supplied to the laser diode 1 becomes the sum of the output current $I_{F1}'$ of the first current source 4 and the output current $I_{F2}'$ of the second current source 13. The output current $I_{F2}'$ increases toward the level of an output current $I_{F2}$ so that the optical output of the laser diode 1 reaches the desired output level $P_{O2}$. The desired output level $P_{O2}$ is obtained by adding the currents $I_{F1}'$ and $I_{F2}$ to the laser diode 1. As the current $I_{F1}'$ flowing in the feedback loop A is kept at a constant level (the final value of $I_{F1}'$), the current $I_{F2}'$ oscillates within the range of $\pm \Delta I_{F2}$ (i.e., $I_{F2}' = I_{F2} \pm \Delta I_{F2}$). The value $\Delta I_{F2}$ is obtained by multiplying the output current of the second current source 13 when the second D/A converter 15 is at full scale and the resolution of the second D/A converter 15. Namely, $\Delta I_{F2}$ is the current of the second current source 13 which corresponds to the LSB of the second D/A converter 15. Then, the second counter 16 halts counting the pulses of the oscillator 12, and holds the value obtained at that time. The output current $I_{F2}'$ of the second current source 13 is kept at a constant value within the range of $I_{F2} \pm \Delta I_{F2}$.

The degree of the deviation of the final driving current supplied to the laser diode 1 which is a sum of the output currents $I_{F1}'$ and $I_{F2}'$ from the objective value and a sum of the currents $I_{F1}'$ and $I_{F2}$ does not depend on the error of the first feedback loop A (i.e. $\pm \Delta I_{F1}$), but the degree of the deviation only depends on the error of the second feedback loop B (i.e. $\pm \Delta I_{F2}$). As mentioned above, the degree of the error $\pm \Delta I_{F2}$ is proportional to the output current of the second current source 13 when the second D/A converter 15 is at full scale, and also to the resolution of the second D/A converter 15. The output current $I_{F2}'$ of the second current source 13 when the second D/A converter 15 is at full scale can be selected to be sufficiently smaller than the current $I_{F1}$. Consequently, when compared to a system having one feedback loop in which a D/A converter having the same resolution is used, the error of the system of FIG. 1 which corresponds to $\Delta I_{F2}$ is very small, resulting in so that the optical output $P_O$ can be controlled with high accuracy.

The first reference voltage $V_{ref1}$ may be set to be slightly higher than the voltage corresponding to the desired optical output $P_{O2}$ so that the optical output of the laser diode 1 approaches the desired value from the side of higher values. In this case, the result is the same as that obtained in the system described above.

Figure 7:
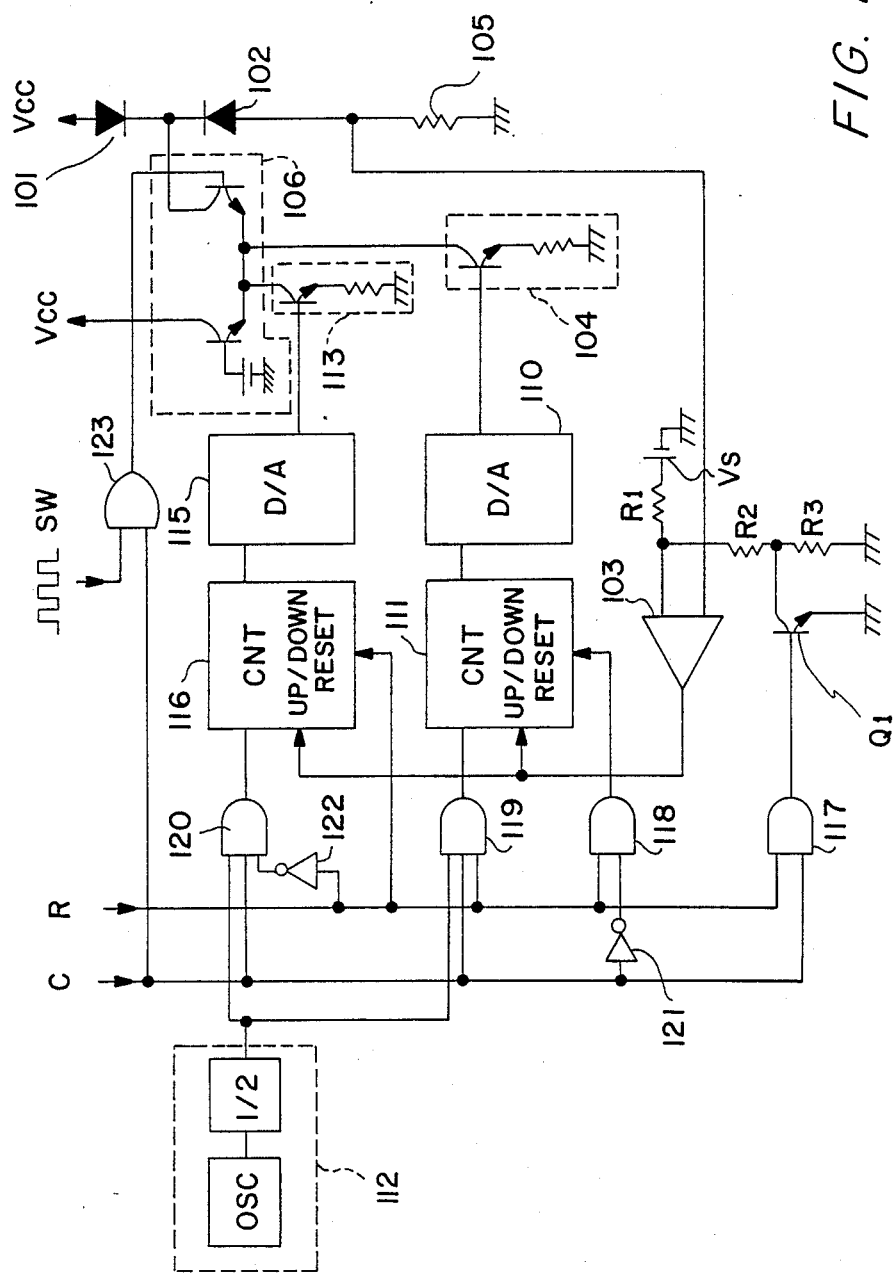
FIG. 7 is a diagram showing a second embodiment of the invention.

FIG. 7 shows a second more specific embodiment of the invention. The system of FIG. 7 comprises a semiconductor laser diode 101, a photodiode 102, a resistor 105, a high-speed switch 106, first and second current sources 104 and 113, first and second D/A converters 110 and 115, first and second up/down counters 111 and 116, and an oscillator 112. In the system of FIG. 7, the first and second reference voltages $V_{ref1}$ and $V_{ref2}$ are supplied by the circuit which consists of a comparator 103, a voltage source $V_S$, resistors $R_1$, $R_2$ and $R_3$, and a transistor $Q_1$. The system of FIG. 7 further comprises AND gates 117 to 120, NOT gates 121 and 122, and an OR gate 123.

The output of the comparator 103 is connected to the up/down terminal of each of the counters 111 and 116. The output pulses of the oscillator 112 are supplied to the first and second counters 111 and 116 through the AND gates 119 and 120, respectively. As shown in FIG. 7, control signals R and C are sent from a control means (not shown) and are supplied to the reset terminals of the first and second counters 111 and 116, and the base of the transistor Q1 through the gates 117 to 122. Switching pulses SW and the control signal C are supplied to input terminals of the OR gate 123. The output of the OR gate 123 is supplied to the switch 106. When the transistor Q1 is on, the first reference voltage $V_{ref1}$ is applied to one input terminal of the comparator 103. When the transistor Q1 is off, the second reference voltage $V_{ref2}$ which is higher than the first reference voltage $V_{ref1}$ is applied to one input terminal of the comparator 103.

The process of setting the optical output of the laser diode to a constant value comprises stages a to d. In the stages a to d, the control signal R is changed in the sequence of "1, 1, 0, and 0", and the control signal C is changed in the sequence of "0, 1, 1, and 0".

In stage a, the control signal R is "1", and the control signal C is "0". Thereby, both the first and second counters 111 and 116 are reset and the output pulses of the oscillator are inhibited from entering into the counters 111 and 116. Therefore, the laser diode 101 is not driven in stage a.

In stage b, both the control signals R and C are "1". The transistor Q1 is turned on to apply the first reference voltage $V_{ref1}$ to one input terminal of the comparator 103. The output of the comparator 103 becomes high so that the first counter 111 starts the counting up the pulses of the oscillator 112. During stage b, the switch 106 is on. A first feedback loop consisting of the laser diode 101, the comparator 103, the first counter 111, the first converter 110, the first current source 104, and the switch 106 begins to supply the forward current $I_{F1}'$ to the laser diode 101, while increasing the forward current $I_{F1}'$ to the vicinity of the current $I_{F1}$ which corresponds to the initial target value $P_{O1}$ of the optical output.

Then, the control signal R is changed to "0" (stage c). In stage c, the pulses of the oscillator 112 are not supplied to the first counter 111. The first counter 111 halts the counting operation so that the first feedback loop maintains the supply of the forward current $I_{F1}'$ corresponding to the value of the first counter 111 where the value of the first counter 111 has been obtained at the end of the stage b. The transistor Q1 is turned off and is prevented from applying the second reference voltage $V_{ref2}$ to one input terminal of the comparator 103. The second counter 116 starts counting up the pulses of the oscillator 112. A second feedback loop consisting of the laser diode 101, the comparator 103, the second counter 116, the second converter 115, the second current source 113, and the switch 106 begins to supply the forward current $I_{F2}'$ to the laser diode 101. In the same manner as the system of FIG. 1, the driving current of the laser diode 101 which is the sum of the currents $I_{F1}'$ and $I_{F2}'$ increases to the level at which the desired optical output $P_{O2}$ is obtained.

Thereafter, the control signal C is changed to "0" (stage d). The second counter 116 halts the counting operation so that the second feedback loop maintains the supply of the forward current $I_{F2}'$ corresponding to the value of the second counter 116 where the value of the second counter 116 has been obtained at the end of the stage c. Therefore, the laser diode 101 is driven by the sum of the currents $I_{F1}'$ and $I_{F2}'$ which corresponds to the desired optical output $P_{O2}$. The switch 106 is turned on and off in synchronization with the switching pulse SW so that the laser diode 101 which emits a laser beam of the desired level $P_{O2}$ is turned on and off at a high speed.

In this way, the system of FIG. 7 can control the optical output with high accuracy. The control logic and operation of the system of FIG. 7 are summarized in Table 1.

TABLE 1

| Stage | R | C | Counter 111 | Counter 116 | Q1 | Switch 106 |
|---|---|---|---|---|---|---|
| a | 1 | 0 | Reset | Reset | Off | On or off according to SW |
| b | 1 | 1 | Count | Reset | On | On |
| c | 0 | 1 | Halt | Count | Off | On |
| d | 0 | 0 | Halt | Halt | Off | On or off according to SW |

Figure 8:
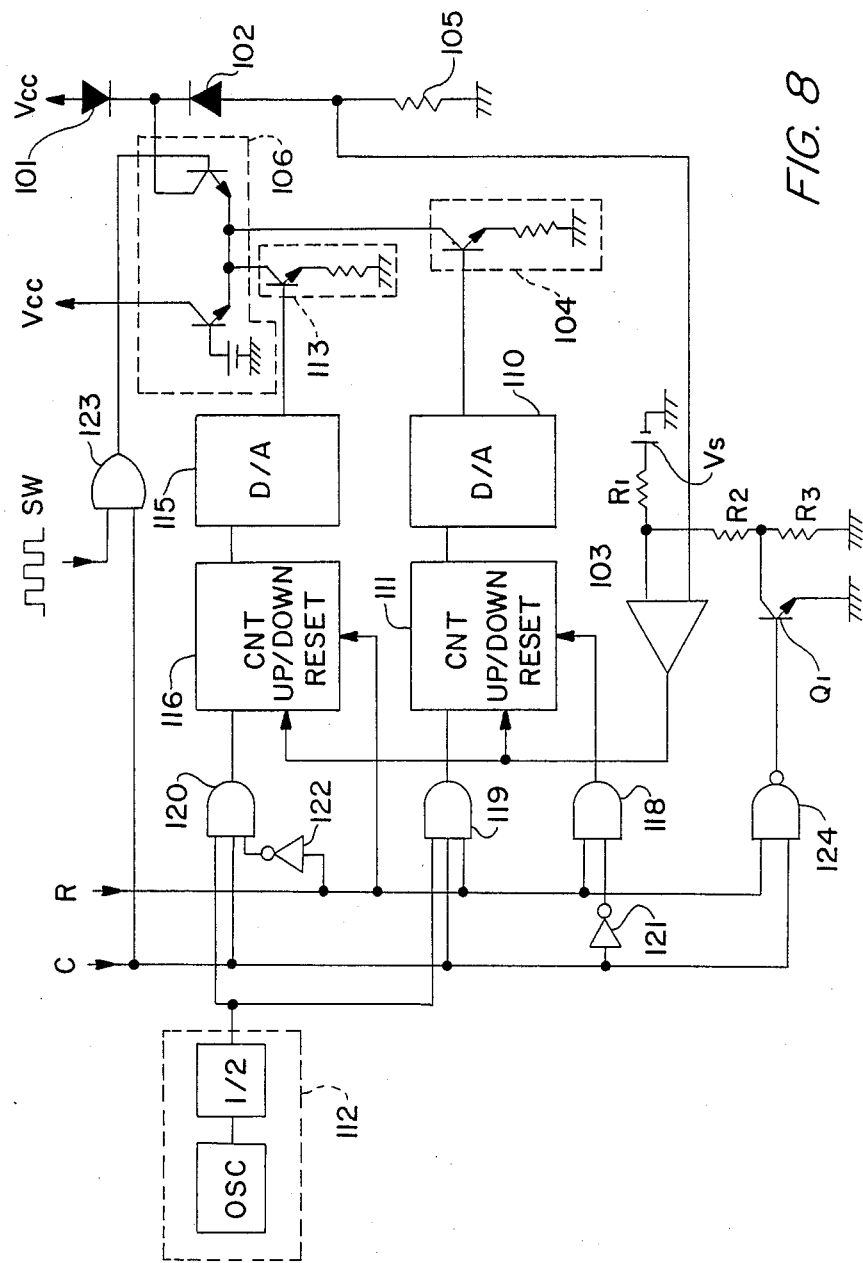
FIG. 8 is a diagram showing a third embodiment of the invention.
Figure 9:
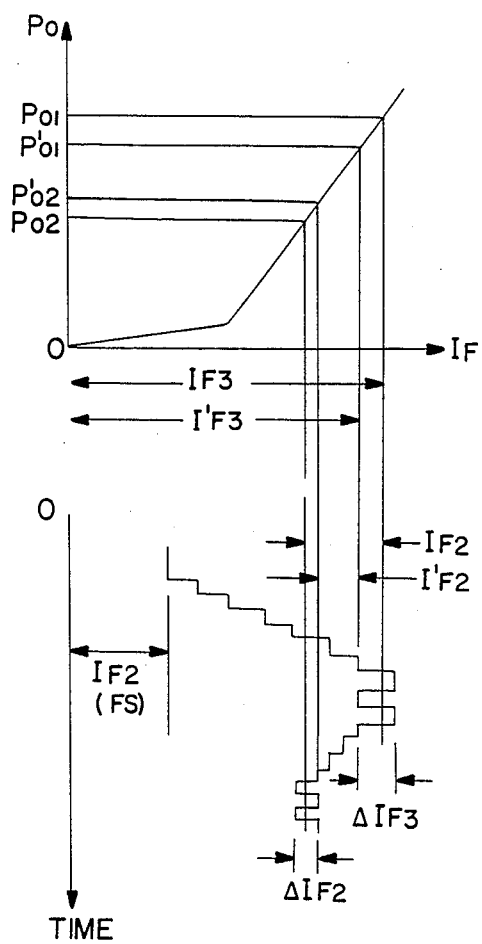
FIG. 9 is a graph showing an $I_F - P_O$ characteristic of a laser diode and also a manner of controlling the forward current according to the third embodiment as shown in FIG. 8.

A third embodiment of the invention is shown in FIG. 8. The arrangement of the system of FIG. 8 is substantially the same as the arrangement of the system of FIG. 7 except that a NAND gate 124 is provided instead of the AND gate 117 and that the control signal R is supplied to the set terminal of the second counter 116. In the system of FIG. 8, the initial output level $P_{O1}$ which is obtained by the forward current $I_{F1}'$ is set to be higher than the desired level $P_{O2}$ of the optical output. When the set terminal of the counter 116 is HIGH, the counter 116 is set to have a value of the full scale. As shown in FIG. 9, the optical output approaches the desired value $P_{O2}$ from the side of higher values. The operation of the system of FIG. 8 is summarized in Table 2.

TABLE 2

| Stage | R | C | Counter 111 | Counter 116 | Q1 | Switch 106 |
|---|---|---|---|---|---|---|
| a | 1 | 0 | Reset | Set | On | On or off according to SW |
| b | 1 | 1 | Count | Set | Off | On |
| c | 0 | 1 | Halt | Count | On | On |
| d | 0 | 0 | Halt | Halt | On | On or off according to SW |

Figure 11:
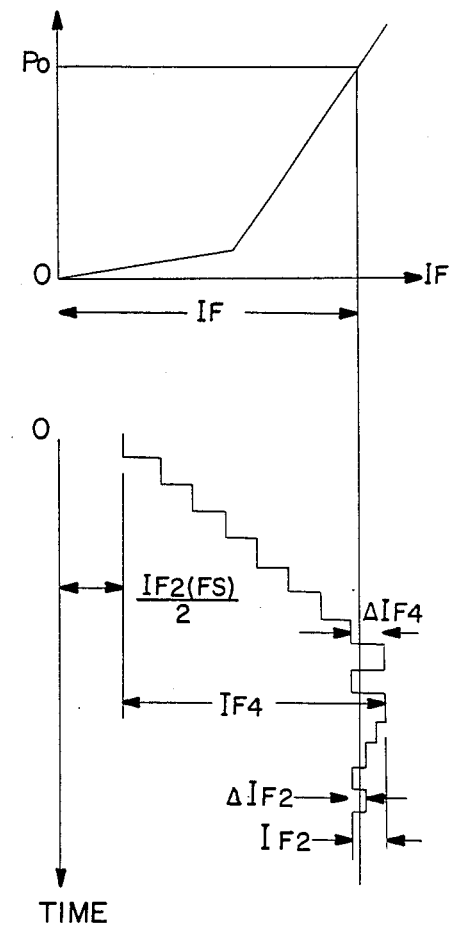
FIG. 11 is a graph showing an $I_F - P_O$ characteristic of a laser diode and also a manner of controlling the forward current according to the fourth embodiment as shown in FIG. 10.
Figure 10:
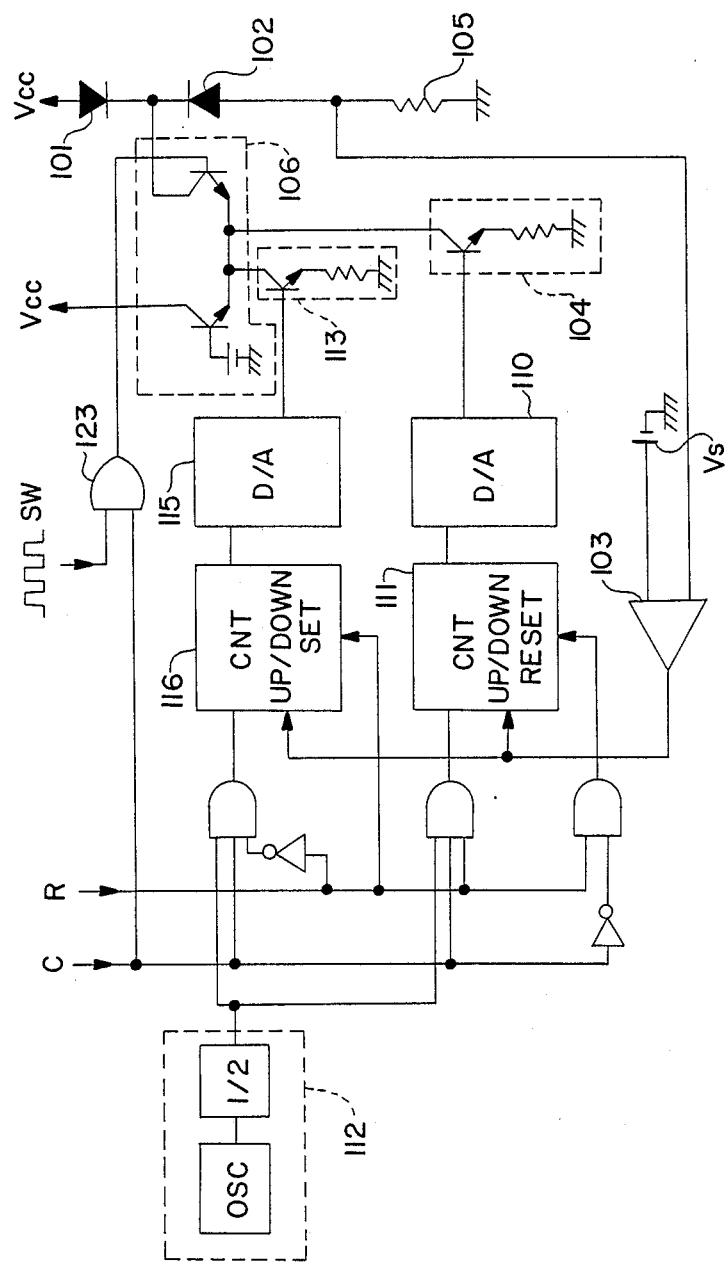
FIG. 10 is a diagram showing a fourth embodiment of the invention.

FIG. 10 illustrates a fourth embodiment of the invention. According to the system of FIG. 10, an initial output level which is obtained by the first feedback loop (coarse adjustment) is set to a value which is the same as the desired (final) output level $P_O$. Thereby, the system of FIG. 10 does not require the components for changing the level of the reference voltage (i.e., the resistors R1 to R3 and the transistor Q1) which are used in the systems of FIGS. 7 and 8. When the set terminal is HIGH, the counter 116 disposed in the second feedback loop (fine adjustment) is set to have a half value of the full scale. The operation of the system of FIG. 10 is illustrated in FIG. 11 and is summarized in Table 3.

TABLE 3

| Stage | R | C | Counter 111 | Counter 116 | Switch 106 |
|---|---|---|---|---|---|
| a | 1 | 0 | Reset | ½ × full scale | On or off according to SW |
| b | 1 | 1 | Count | ½ × full scale | On |
| c | 0 | 1 | Halt | Count | On |
| d | 0 | 0 | Halt | Halt | On or off according to SW |

Figure 13:
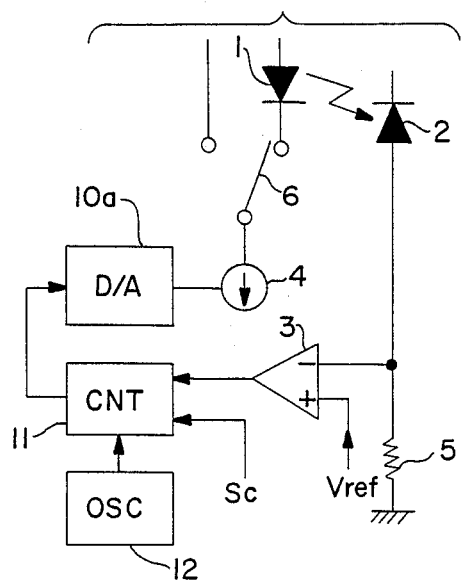
FIG. 13 is a diagram showing a fifth embodiment of the invention.
Figure 14A:
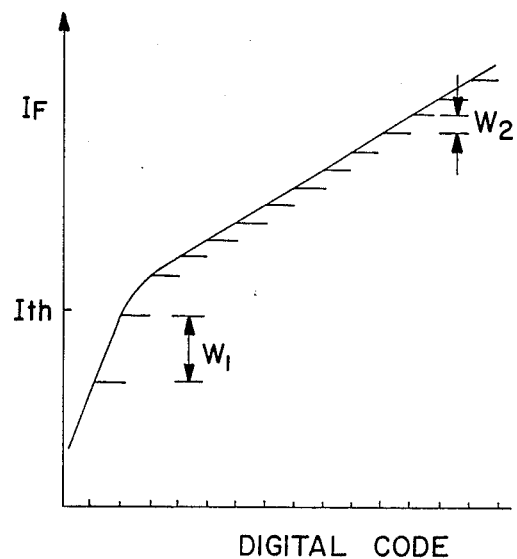
FIGS. 14(a) and 14(b) are graphs similar to FIGS. 12(a) and 12(b), according to the fifth embodiment as shown in FIG. 13.

FIG. 13 shows a fifth embodiment of the invention. The configuration of the system shown in FIG. 13 is similar to the configuration of the system of FIG. 5, but a D/A converter 10a having non-linear characteristics is employed instead of the converter 10 in the system of FIG. 5. The relation between an input (digital codes)

and an output (forward current $I_F$) of the D/A converter 10a in this embodiment is shown in FIG. 14(a). In the range where the forward current $I_F$ is smaller than the threshold current $I_{th}$, the quantization width $W_1$ is wide, and in the range where the forward current $I_F$ is larger than the threshold current $I_{th}$, the quantization width $W_2$ is narrow.

Figure 12A:
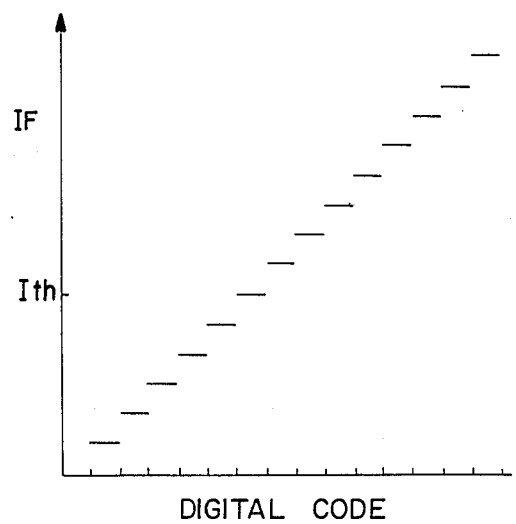
FIGS. 12(a) and 12(b) are respectively a graph showing a relation between digital codes and the forward current and a graph showing a relation between digital codes and the optical output of the laser diode, according to the third conventional example as shown in FIG. 5.
Figure 12B:
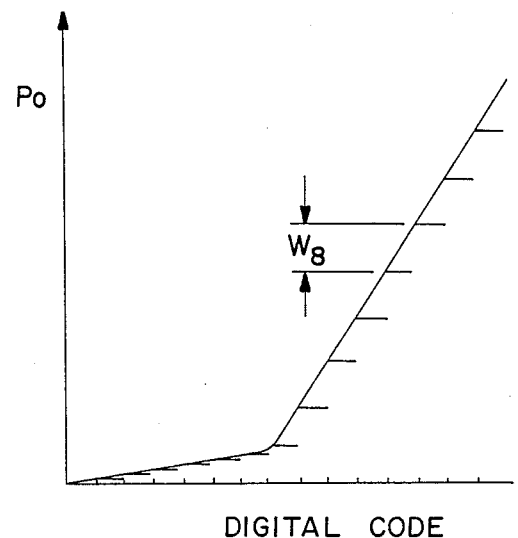
Figure 14B:
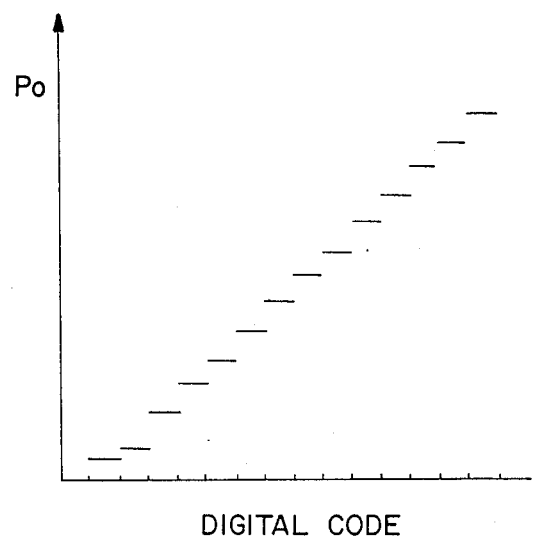

FIG. 14(b) shows a relation between the optical output $P_O$ and the digital codes of the D/A converter 10a in this embodiment. Because of the non-linear characteristics of the converter 10a, number of the digital codes which correspond to the current levels lower than the threshold current $I_{th}$ is small, when compared to the number of the conventional system which is shown in FIG. 12. In other words, the number of codes which are effective in the control of the optical output of the laser diode is large even when the D/A converter 10a has the same number of digital codes as the D/A converter 10 of FIG. 5. Thereby, an improved effective resolution of the D/A converter 10a results and a very accurate control of the optical output also results.

Figure 15:
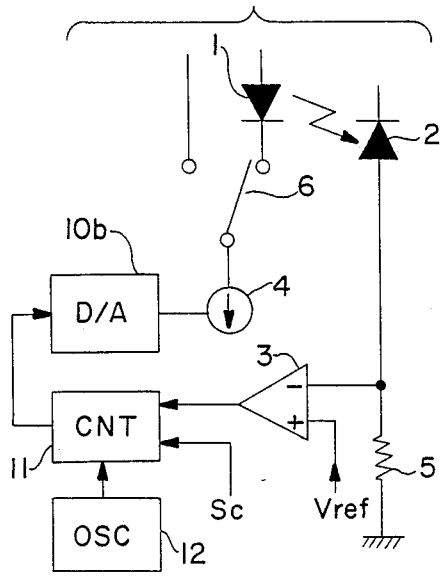
FIG. 15 is a diagram showing a sixth embodiment of the invention.
Figure 16A:
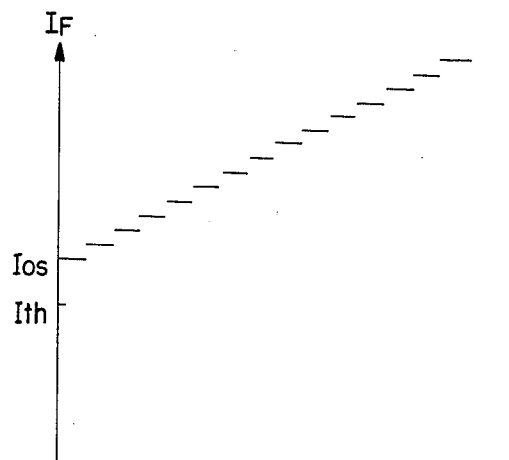
FIGS. 16(a) and 16(c) are respectively a graph showing an example of relation between digital codes and the forward current and a graph showing a relation between digital codes and the optical output of the laser diode, according to the sixth embodiment as shown in FIG. 15.
Figure 16B:
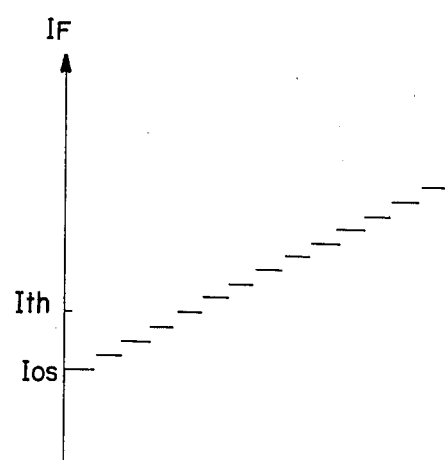
FIGS. 16(b) and 16(d) are respectively a graph showing another example of relation between digital codes and the forward current and a graph showing a relation between digital codes and the optical output of the laser diode, according to the sixth embodiment as shown in FIG. 15.
Figure 16C:
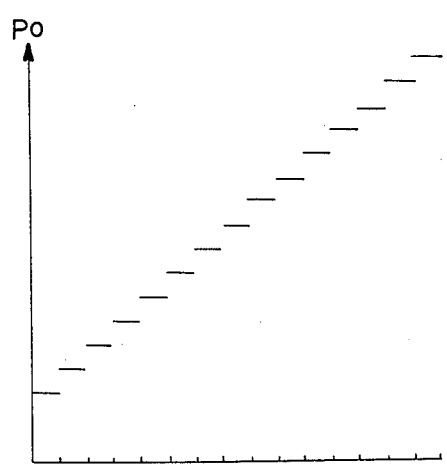
Figure 16D:
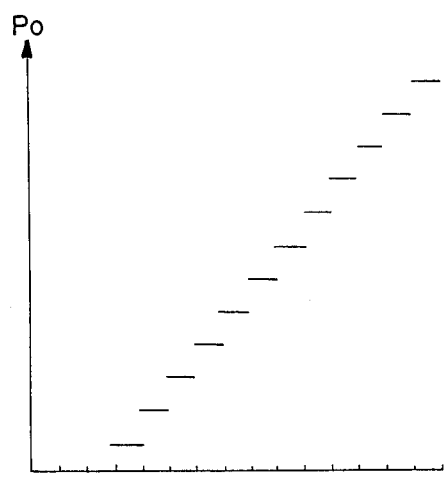

FIG. 15 shows a sixth embodiment of the invention. The configuration of the system shown in FIG. 15 is similar to the configuration of the system of FIG. 13, but a D/A converter 10b is employed that has characteristics of an offset current at a certain level flows when the digital code is zero. In an example of the characteristic shown in FIG. 16(a), the offset current $I_{OS}$ is greater than the threshold current $I_{th}$. In another example shown in FIG. 16(b), the offset current $I_{OS}$ is smaller than the threshold current $I_{th}$. The relation between an input (digital code) and an output (forward current $I_F$) of the D/A converter 10b having the characteristics of FIG. 16(a) is shown in FIG. 16(c), and the characteristics of the D/A converter 10b having the characteristics of FIG. 16(b) is shown in FIG. 16(d). No digital codes are in the range lower than the threshold current $I_{th}$ (FIG. 16(a)), or a small number of digital codes are in the range lower than the threshold current $I_{th}$ (FIG. 16(b)). Namely, the number of codes which are effective in the control of the optical output of the laser diode is large even when the D/A converter 10b has the same number of digital codes as the number of the D/A converter 10 of FIG. 5, and an improved effective resolution of the D/A converter 10b results and a very accurate control of the optical also results.

FIG. 17 shows a seventh embodiment of the invention. The configuration of the system shown in FIG. 17 is similar to the configuration of the system of FIG. 15 except that a second current source 4a is provided. The current source 4a supplies an offset current $I_{OS}$ at a certain level to the laser diode 1, i.e., the laser diode 1 is driven by the sum of the forward current $I_F$ and the offset current $I_{OS}$. FIGS. 18(a) and 18(b) show the relations between digital codes of the D/A converter 10 and optical outputs $P_O$ of the laser diode 1 when the offset current $I_{OS}$ is greater or smaller than the threshold current $I_{th}$, respectively. When the offset current $I_{OS}$ is smaller than the threshold current $I_{th}$, the number of codes which are ineffective in the control of the optical output of the laser diode 1 is small (FIG. 18(b)). When the offset current $I_{OS}$ is greater than the threshold current $I_{th}$, no code is ineffective in the control of the optical output of the laser diode 1 (FIG. 18(a)). Consequently, the quantization widths $W_3$ (FIG. 18(a)) or $W_4$ (FIG. 18(b)) in the system of FIG. 17 is narrow, when compared to the quantization widths obtained by the system of FIG. 5 even when the D/A converters 10 used in both systems have the same resolution characteristics, and an improved effective resolution of the D/A converter 10 results and a very accurate control of the optical output also results.

Figure 19:
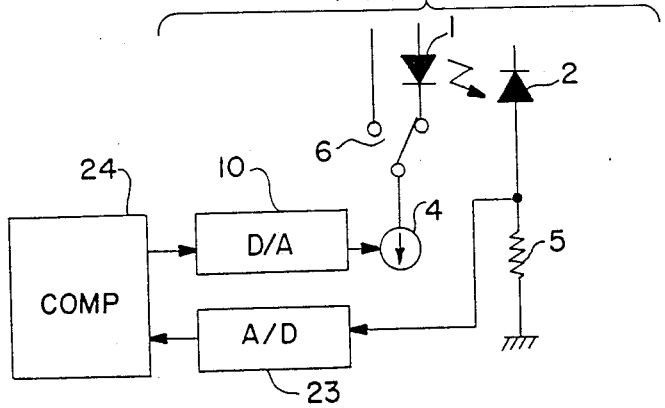
FIG. 19 is a diagram an eighth embodiment of the invention.

FIG. 19 shows diagramatically shows an eighth embodiment of the invention. In the system of FIG. 19, the monitor signal detected by the circuit consisting of a photodiode 2 and a resistor 5 is converted to digital codes by an A/D converter 23, and the signal is sent to computing means 24 which has a memory. The digital codes from the A/D converter 23 are processed in the computing means 24. The obtained result is fed back to a laser diode 1 through a D/A converter 10, a current source 4, and a switch 6.

Figure 20:
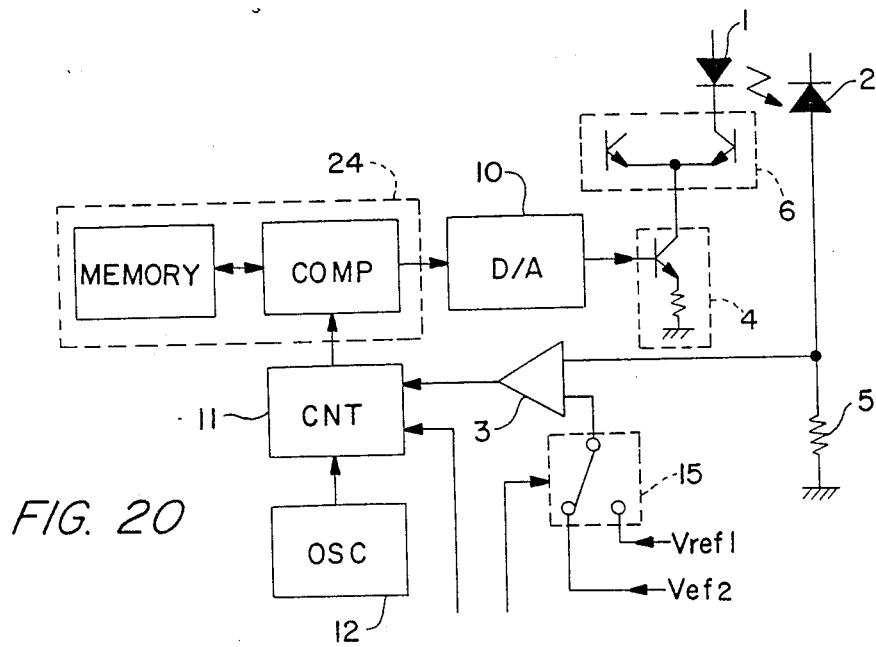
FIG. 20 is a diagram of a ninth embodiment of the invention.

The system of FIG. 19 will be described more specifically with reference to FIG. 20. The system of FIG. 20 is constructed so that an optical output of any desired level can be obtained only by conducting the calibration two times. In the example, the A/D converter 23 consists of a comparator 3, an analog switch 15, an up-/down counter 11, and an oscillator 12. In the system of FIG. 20, the relationship between the optical output $P_O$ and a forward current $I_F$ can be calculated by the following Equation (1):

$$P_O = \eta I_F + \zeta \qquad (1)$$

For example, the calibration is conducted for two optical output levels $P_{O1}$ and $P_{O2}$ for obtaining an amount of the forward current $I_F$ for each output level. When a value $I_{F1}$ is obtained for the output level $P_{O1}$ and a value $I_{F2}$ is obtained for the output level $P_{O2}$, the constants can be calculated from the following Equations (2) and (3):

$$\eta = \frac{P_{O2} - P_{O1}}{I_{F2} - I_{F1}} \qquad (2)$$

$$\zeta = \frac{P_{O1}I_{F2} - P_{O2}I_{F1}}{I_{F2} - I_{F1}} \qquad (3)$$

Figure 21:
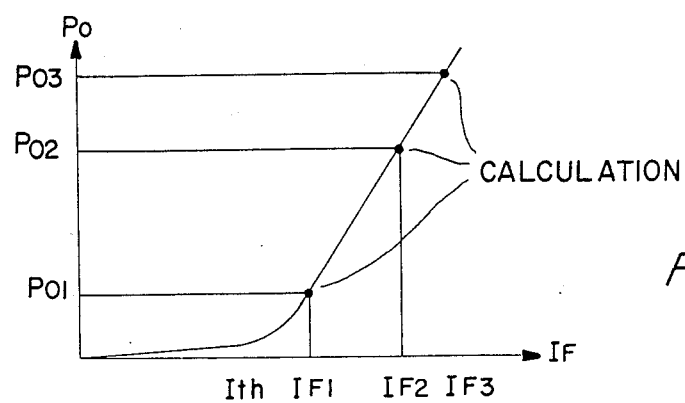
FIG. 21 is a graph for illustrating the operation of the eighth and ninth embodiments shown in FIGS. 19 and 20.

Therefore, a level $I_{F3}$ of the forward current which is required for obtaining an optical output of any desired level $P_{O3}$ can be calculated from the Equation (1). This is illustrated in FIG. 21.

The operation of the system of FIG. 20 will be described as follows. The values of the two levels $P_{O1}$ and $P_{O2}$ are previously stored in the memory of the computing means 24 for conducting the calibration. The calibration is done by applying the reference voltage $V_{ref1}$ or $V_{ref2}$ to the comparator 3. The reference voltages $V_{ref1}$ and $V_{ref2}$ correspond to the optical output levels $P_{O1}$ and $P_{O2}$, respectively. The output of the counter 11 obtained at each calibration is stored in the memory of the computing means 24. The stored output of the counter 11 corresponds to the forward current $I_{F1}$ or $I_{F2}$ and the laser diode 1 is driven to emit the optical output of the level $P_{O1}$ or $P_{O2}$. From the stored data, $\eta$ and $\zeta$ are calculated using the Equations (2) and (3). Then, the system conducts an operation process for driving the laser diode 1. When an optical output of another level $P_{O3}$ is to be emitted, the computing means 24 calculates the value of a forward current $I_{F3}$ which is necessary for obtaining the desired optical output level $P_{O3}$. This is calculated from Equation (1), and is sent to the D/A converter 10. As is easily understood from the above description, the feedback loop from the photodiode 2 to the counter 11 is not necessary when driving the laser diode 1. Even when the desired optical output level $P_{O3}$ is rapidly changed. Therefore, the system can precisely drive the laser diode 1 at the desired level $P_{O3}$. The calibration may be conducted when an operating condition affecting the optical output level (for example, an ambient temperature) varies.

As seen from the above-mentioned description of the preferred embodiments, a D/A converter having low resolution which can be easily produced at a low cost can be used in an apparatus of the present invention. Therefore, an apparatus of the present invention can be easily manufactured at low cost and is easily integrated.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for driving a semiconductor laser device to develop a predetermined constant optical output comprising:
    means for monitoring an optical output of the laser device and generating a signal representative of the optical output;
    first driving means for coarsely driving the laser device to a first optical output when said signal is less than a reference value; and
    second driving means for finely driving the laser device to the predetermined constant optical output when said signal exceeds said reference value.

2. An apparatus according to claim 1, wherein said first driving means comprises a first feedback loop and said second driving means comprises a second feedback loop.

3. An apparatus according to claim 2, wherein said first feedback loop comprises:
    first comparing means for comparing said signal with said reference value and providing said signal when said signal is less than said reference value;
    first counting means for developing a first digital signal for said signal being provided from said first comparing means;
    first D/A converting means for developing a first control signal in response to said first digital signal; and
    first current supply means for driving the laser device at said first optical output in response to said first control signal.

4. An apparatus according to claim 2, wherein said second feedback loop comprises:
    second comparing means for comparing said signal with said reference value and providing said signal when said signal exceeds said reference value;
    second counting means for developing a second digital signal for said signal being provided from said second comparing means;
    second D/A converting means for developing a second control signal in response to said second digital signal; and
    second current supply means for driving the laser device at the predetermined constant optical output in response to said second control signal.

5. An apparatus according to claim 1, wherein said means for monitoring comprises a photodiode.

6. An apparatus according to claim 3, wherein said first D/A converting means has non-linear characteristics.

7. An apparatus according to claim 3, wherein said first D/A converting means generates an offset current when said first digital signal is zero.

8. An apparatus according to claim 2, wherein said first feedback loop comprises first control means for developing a first calculated control signal corresponding to said first optical output.

9. An apparatus according to claim 8, wherein said first control means comprises a first memory for storing said first calculated control signal and the optical output of the laser device, said first control means developing subsequent first calculated control signals based on the contents in said first memory.

10. An apparatus according to claim 3, wherein said second D/A converting means has non-linear characteristics.

11. An apparatus according to claim 3, wherein said second D/A converting means generates an offset current when said second digital signal is zero.

12. An apparatus according to claim 2, wherein said second feedback loop comprises second control means for developing a second calculated control signal corresponding to the predetermined constant optical output.

13. An apparatus according to claim 12, wherein said second control means comprises a second memory for storing said second calculated control signal and the optical output of the laser device, said second control means developing subsequent second calculated control signals based on the contents in said second memory.

14. A method for driving a semiconductor laser device to develop a predetermined constant optical output comprising the steps of:
    monitoring the optical output of the laser device;
    generating a signal representative of the optical output in response to said step of monitoring;
    coarsely driving the laser device to a first optical output when said signal is less than a reference value; and
    finely driving the laser device to the predetermined constant optical output when said signal exceeds said reference value.

15. An apparatus for driving a semiconductor laser device to develop a predetermined constant optical output comprising:
    means for monitoring an optical output of the laser device and generating a signal representative of the optical output;
    means for developing a first driving current for coarsely driving the laser device when said signal is less than a reference value;
    means for developing a second driving current for finely driving the laser device when said signal exceeds said reference value; and
    means for driving the laser device at the predetermined constant optical output in response to said first and second driving currents.

16. An apparatus according to claim 15, wherein said means for developing said first driving current comprises a first feedback loop and said means for developing said second driving current comprises a second feedback loop.

17. An apparatus according to claim 16, wherein said first feedback loop comprises:

first comparing means for comparing said signal with said reference value and providing said signal when said signal is less than said reference value;

first counting means for developing a first digital signal for said signal being provided from said first comparing means;

first D/A converting means for developing a first control signal in response to said first digital signal; and first current supply means for developing said first driving signal in response to said first control signal.

18. An apparatus according to claim 16, wherein said second feedback loop comprises:

second comparing means for comparing said signal with said reference value and providing said signal when said signal exceeds said reference value;

second counting means for developing a second digital signal for said signal being provided from said second comparing means;

second D/A converting means for developing a second control signal in response to said second digital signal; and second current supply means for developing said second driving signal in response to said second control signal.

19. An apparatus for driving a semiconductor laser device and maintaining an optical output of said laser device at a predetermined level comprising:

monitoring means for monitoring the optical output of said laser device;

a first D/A converter for conducting a coarse adjustment of the optical output; and a second D/A converter for conducting a fine adjustment of the optical output.

20. An apparatus for driving a semiconductor laser device according to claim 19, wherein first and second feedback loops are formed to maintain the optical output at the predetermined level, said first and second D/A converters being disposed in said first and second feedback loops, respectively.

21. An apparatus for driving a semiconductor laser device according to claim 20, wherein said first and second D/A converters disposed in said first and second feedback loops for controlling the optical output of said laser device have non-linear characteristics.

22. An apparatus for driving a semiconductor laser device according to claim 20, wherein said first and second D/A converters disposed in said first and second feedback loops for controlling the optical output of said laser device have offset outputs.

23. An apparatus for driving a semiconductor laser device according to claim 19, further comprising current supplying means for supplying a predetermined amount of current to said laser device for maintaining the optical output at the predetermined level.

24. An apparatus for driving a semiconductor laser device according to claim 19, further comprising control means for controlling the optical output of said laser device by outputting a control output, said control means comprising memory means for storing relations between the optical output of said laser device and said control output of said control means, wherein said control means calculates said control output from said relations stored in said memory means corresponding to said predetermined level and supplying said control output to said first and second D/A converters.

* * * * *